US009817937B2

(12) United States Patent
Suzuki et al.

(10) Patent No.: US 9,817,937 B2
(45) Date of Patent: Nov. 14, 2017

(54) AREA EFFICIENT POWER SWITCH

(71) Applicant: Apple Inc., Cupertino, CA (US)

(72) Inventors: Shingo Suzuki, San Jose, CA (US);
Karthik Rajagopal, Mountain View, CA (US); Bo Tang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 129 days.

(21) Appl. No.: 14/880,420

(22) Filed: Oct. 12, 2015

(65) Prior Publication Data

US 2016/0034630 A1 Feb. 4, 2016

Related U.S. Application Data

(62) Division of application No. 14/217,570, filed on Mar. 18, 2014, now Pat. No. 9,189,586, which is a division of application No. 13/628,581, filed on Sep. 27, 2012, now Pat. No. 8,726,216.

(51) Int. Cl.
*G06F 17/50* (2006.01)
(52) U.S. Cl.
CPC .................. *G06F 17/5072* (2013.01)
(58) Field of Classification Search
USPC ........................................................ 716/122
See application file for complete search history.

(56) References Cited

U.S. PATENT DOCUMENTS

| 7,509,613 | B2 * | 3/2009 | Frenkil ............... G06F 17/5068 |
| | | | 326/119 |
| 7,829,973 | B2 * | 11/2010 | Schultz .................... H01G 4/40 |
| | | | 257/532 |
| 7,956,669 | B2 | 6/2011 | Chuang et al. |
| 8,341,563 | B1 | 12/2012 | Kretchmer |
| 8,726,216 | B2 | 5/2014 | Suzuki et al. |
| 2006/0022733 | A1 * | 2/2006 | Nair .......................... G06F 1/26 |
| | | | 327/210 |
| 2006/0134853 | A1 | 6/2006 | Shaw et al. |
| 2009/0321791 | A1 | 12/2009 | Wagner |
| 2011/0083116 | A1 * | 4/2011 | Pineda de |
| | | | Gyvez ................. G06F 17/5072 |
| | | | 716/120 |
| 2012/0151426 | A1 | 6/2012 | Marrou |
| 2014/0201698 | A1 | 7/2014 | Suzuki et al. |

* cited by examiner

*Primary Examiner* — Bryce Aisaka
(74) *Attorney, Agent, or Firm* — Meyertons, Hood, Kivlin, Kowert & Goetzel, P.C.; Gareth M. Sampson; Lawrence J. Merkel

(57) ABSTRACT

A method of generating an area efficient power switch cell includes receiving, by a cell library design tool, a specification of a power switch circuit to be established as a power switch cell in a cell library. The cell library design tool also receives one or more attributes of the power switch cell including a height of the cell boundary and receiving, by the cell library design tool, a layout placement constraint requiring the power switch cell to be placed in a semiconductor layout so as to bridge two parallel rows of doped wells. The parallel rows of doped wells are interleaved with doped substrate and the doping of the wells is of a different type than that of the substrate. Based on the specification of the power switch circuit, the one or more attributes, and the layout placement constraint, the cell library design tool generates the power switch cell.

20 Claims, 8 Drawing Sheets

AREA EFFICIENT POWER SWITCH

PRIORITY INFORMATION

This application is a divisional application of U.S. patent application Ser. No. 14/217,570, filed Mar. 18, 2014, which is a divisional application of U.S. patent application Ser. No. 13/628,581, filed Sep. 27, 2012 (now U.S. Pat. No. 8,726, 216), which are incorporated by reference herein in their entirety.

BACKGROUND

Technical Field

This disclosure relates generally to integrated circuit layouts and design, and more particularly to methods, systems, and products for generating an area efficient power switch cell of a cell library and for generating an integrated circuit layout for fabrication.

Description of the Related Art

In recent years, mobile devices such as smart phones and tablet computers have become increasingly sophisticated. In addition to supporting telephone calls, many mobile devices now provide access to the internet, email, text messaging, and navigation using the global positioning system (GPS). Mobile devices that support such sophisticated functionality often include many components. To remain a mobile, physical size of such components of a mobile device is a design concern. Designers of such mobile devices, often attempt to reduce the size of components or modify the components to provide greater functionality without increasing the size of the components. Such reductions or modifications may be carried out any level of the mobile device, including the layout of the integrated circuits of the components themselves.

Integrated circuit layout designers, however, are often faced with challenges that limit the amount reduction in size of components or modifications to components to increase functionality without increasing the size of the components. FIG. 1, for example, sets forth a line drawing of a birds-eye view of a prior art integrated circuit layout.

The example integrated circuit layout of FIG. 1 includes a p-type substrate 116 interleaved with parallel rows of n-wells 118. The integrated circuit layout also includes three columns of pMOS power switch cells 102. The first column includes three pMOS power switch cells 102, the second column includes two pMOS power switch cells 102, and the third column includes three power switch cells 102.

FIG. 1 also depicts an expanded view of one of the pMOS power switch cells 102 and a standard cell 108. The pMOS power switch cell 102 includes pMOS logic 110 (transistors, MOSFETs, and the like). The example pMOS power switch 102 cell includes a cell boundary 104. The cell boundary 100 equivalent (or nearly so) to double the height of the standard cell 108. The height of the standard cell 108 is equivalent (or nearly so) to the height of an n-well 118.

The pMOS power switch cell 102 is positioned with the top and bottom portion and the cell boundary 104 approximately centered in the p-type substrate 116. The pMOS power switch cell 102 is also positioned to straddle the n-well.

The standard cell 108 includes nMOS logic 112 and pMOS logic 114. The nMOS logic 112 of the standard cell 108 is positioned on the p-type substrate 116 and the pMOS logic 114 of the standard cell is position on an n-well 118.

Because the nMOS portion 112 of the standard cell 'faces' or, said another, is adjacent to, the pMOS logic 110 of the power switch cell 102, a spacing tolerance is required. That is, a predefined amount of space is required between the pMOS logic 110 of the power switch cell 102 and the nMOS portion 112 of the standard cell 108. Such a spacing requirement is described here as a 'P/N spacing tolerance' 106. In this example, the tolerance is implemented within the power switch 102 cell itself. Given a power switch cell boundary 110 of double height, the area of the internal pMOS logic 110 of the power switch cell 112 is constrained due to the required P/N spacing tolerance 106. The power switch cell, then, does not utilize the area of the cell boundary 110 efficiently.

Although the example integrated circuit layout of FIG. 1 includes a pMOS-based power switch cell 102, a p-type substrate 116, n-wells 118, and the nMOS portion 112 of the standard cell 108 facing the power switch cell 102, it is noted that the required P/N spacing tolerance is also present in other embodiments. For example, in embodiments in which the power switch cell 102 is an nMOS cell, the substrate is an n-type substrate, and the rows of wells include p-wells, a similar P/N spacing tolerance is required. In such an embodiment, the nMOS power switch is positioned with the top and bottom cell boundaries on the n-type substrate and straddling a p-well. Further, the pMOS portion 114 of the standard cell 108 faces the nMOS power switch, resulting in the required P/N spacing tolerance.

It is also noted that similar P/N spacing requirements exist when a power switch is not double height, but rather single height. In such embodiments, the single-height power switch may be positioned with the top of the cell boundary centered (or approximately centered) on a well and the bottom of the cell boundary on the substrate. When a standard cell is place below and adjacent to the power switch cell, the portion of the standard cell facing the power switch cell includes complimentary logic to that of the power switch cell. Thus, a P/N spacing tolerance is required between the two portions of complementary logic.

SUMMARY

Various example methods for generating an area efficient power switch cell for a cell library and for generating an integrated circuit layout that utilizes such a power switch cell are disclosed. One example method of generating an area efficient power switch cell for a cell library includes receiving, by a cell library design tool, a specification of a power switch circuit to be established as a power switch cell in a cell library. The cell library design tool may also receive one or more attributes of the power switch cell including a height of the cell boundary. The cell library design tool may then receive a layout placement constraint requiring the power switch cell to be placed in a semiconductor layout so as to bridge two parallel rows of doped wells. That is, when the wells are implemented as n-wells, the doped substrate is a p-type substrate and vice versa. The parallel rows of doped wells are interleaved with doped substrate and the doping of the wells is of a different type than the doping of the substrate. Based on the specification of the power switch circuit, the one or more attributes, and the layout placement constraint, the cell library design tool then generates the power switch cell.

One example method of generating an integrated circuit layout that utilizes the power switch cell includes placing, by a place-and-route tool in dependence upon a cell library and an integrated circuit netlist, a power switch cell and a standard cell on a doped substrate. The doped substrate, as mentioned above, includes a plurality of parallel rows of doped wells where the doped substrate is interleaved among the rows of doped wells. Further, the doping of the wells is of a different type than the doping of the substrate. In placing the power switch cell and the standard cell, the place-and-route tool may place the power switch cell so as to bridge two parallel rows of the doped wells. The place-and-route tool may also place the standard cell in a column with the power switch cell. The place-and-route tool may place the standard cell so that a first portion of the standard cell faces the power switch cell and is positioned on one of the rows of doped wells bridged by the power switch cell. That is, the standard cell may be placed adjacent to the power switch cell in the same column as the cell. Further, a second portion of the standard cell may be positioned on the doped substrate. In some embodiments, the first portion that faces (or is adjacent to) the power switch cell includes logic of a type complementary to the doping of the wells. That is, in embodiments in which the wells are implemented as n-wells, the portion of the standard cell that faces the adjacent power switch cell may include pMOS logic. The second portion may include logic of a type complementary to the doping of the substrate. Once placed, the place-and-route tool may generate an integrated circuit layout for use in integrated circuit fabrication.

In some embodiments, the power switch cell may be double the height of the standard cell, where the standard cell is equivalent in height to the height of a well. Also, in some embodiments, the power switch cell may be a pMOS header switch cell configured for power gating, the wells may be configured as n-wells and the substrate may be configured as a p-type substrate. In such embodiments, the first portion of the standard cell positioned on the n-well and facing the pMOS header switch may be pMOS logic. In such an embodiment, the second portion of the standard cell that positioned on the p-type substrate may be nMOS logic.

Figure 1:
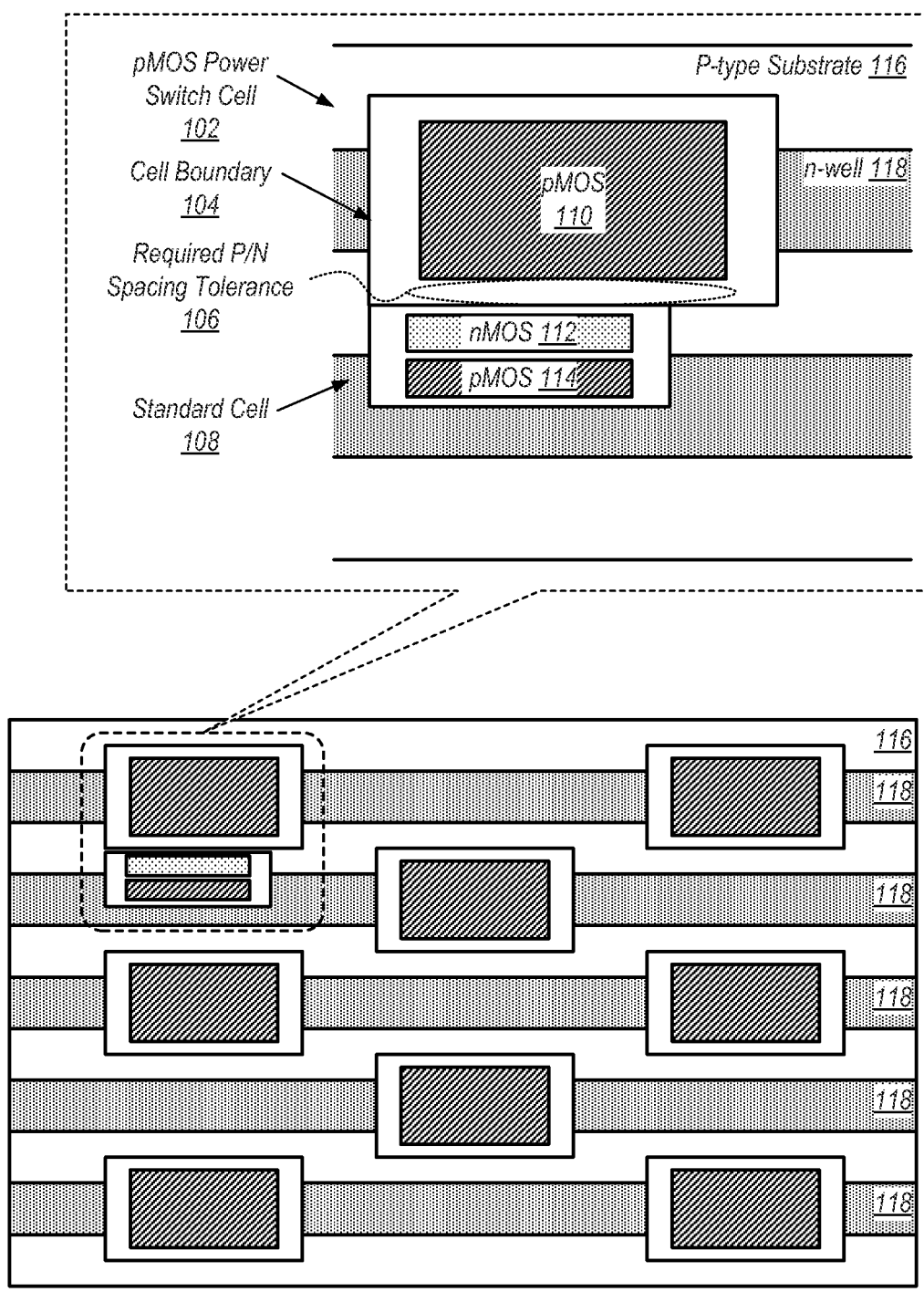
FIG. 1 sets forth a line drawing of a prior art integrated circuit layout.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Figure 2:
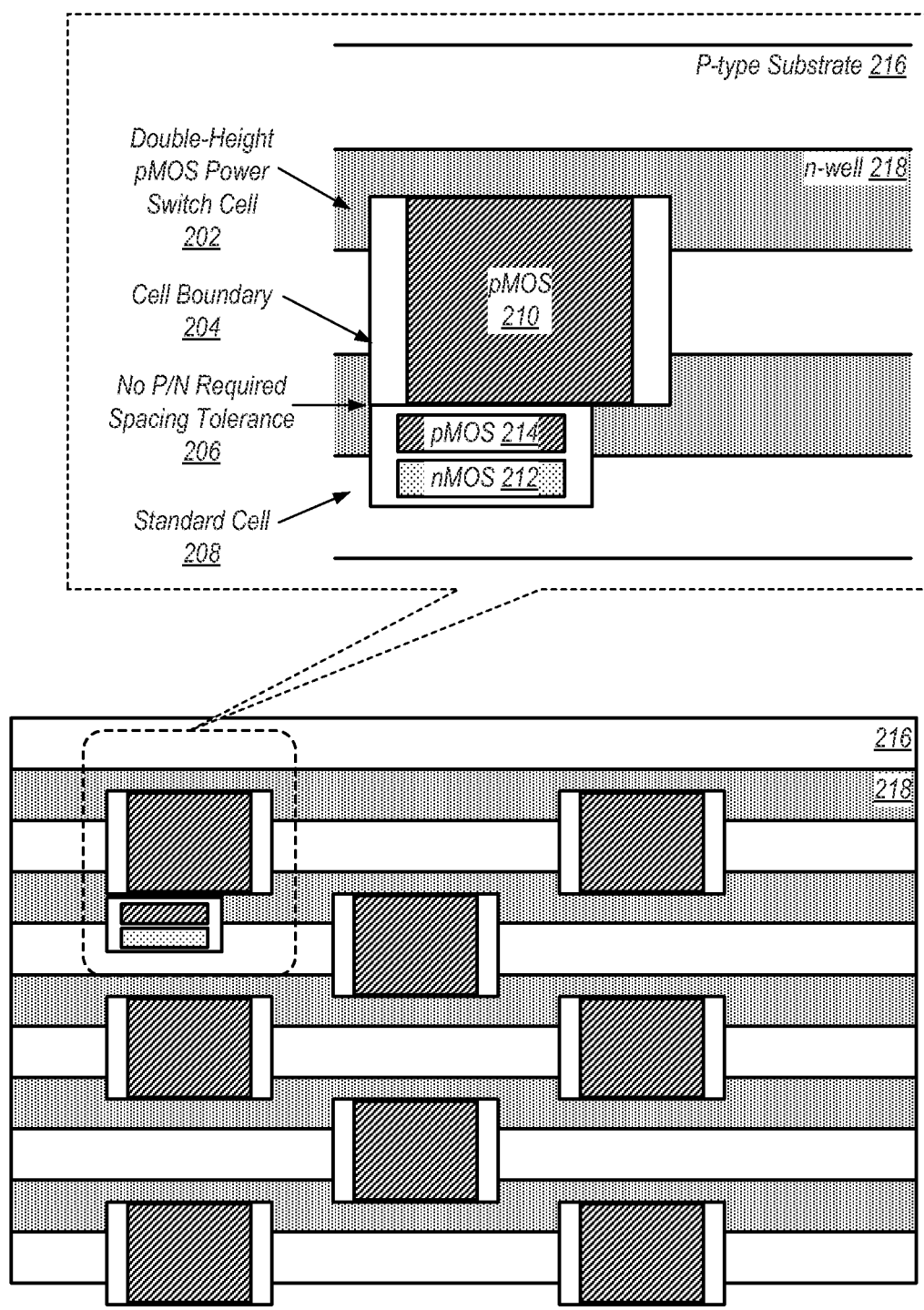
FIG. 2 sets forth a line drawing of an example integrated circuit layout with a double-height area efficient power switch.

FIG. 2 sets forth a line drawing of an example integrated circuit layout with a double-height area efficient power switch. The example integrated circuit layout of FIG. 2 includes a number of pMOS-based power switch cells 202 and one standard cell 208. A 'cell' as the term is used here refers to representation of logic for use in integrated circuit design, simulation, and fabrication. A cell may represent logic in a variety of ways. A cell, for example, may represent logic's electrical schematic via a netlist, functionality, physical attributes, layout characteristics, operational timing characteristics, and the like. A 'cell' may be included in a library of cells for use by integrated circuit designers. A cell may be included in a library of cells for use by an integrated circuit designer. A cell may represent abstract more complicated circuits as a single functional block of logic. A standard cell for example may represent a single AND gate, OR gate, XOR gate, XNOR gate, inverter, latch, or the like, while abstracting the more complicated circuitry that forms the actual block of logic. Such an abstraction enables an integrated circuit designer to utilize a library of cells as reusable building blocks for an integrated circuit without the need to separately design each block of logic represented by a cell.

In the example of FIG. 2, the pMOS-based power switch cells 202 are arranged in three columns. Two columns include three power switch cells and one column includes two power switch cells 202. The standard cell 208 is positioned in a column under and adjacent to a power switch cell 202.

The example integrated circuit layout of FIG. 2 also includes a p-type substrate 216 interleaved with parallel rows of n-wells 218. In many integrated circuit layout embodiments, including the example layout of FIG. 2, representations of substrates and wells are arranged in rows of equal height to provide integrated circuit designers a base layer upon which to construct an integrated circuit layout. The layout may be constructed by placing cells, generally but not always, of a predefined height that is either equivalent to or a multiple of the height of a row. In this way, layout design may be to some extent standardized.

The example power switch cell 202 of FIG. 2 may include one or more transistors, field-effect-transistors (FETs), metal oxide semiconductor FETs (MOSFETs), and the like. In the example of FIG. 2 the logic (transistors, FETs, MOSFETs, and the like) forming the components of the power switch cell 202 are depicted as pMOS logic 210. A power switch may have high commutation speed and relatively high efficiency at low voltages. Power switches may be utilized for power-gating: a power management technique that utilizes switches to cut off VDD (a ground reference voltage, for example) from a circuit block when the block is not switching. When implemented with pMOS transistors, as depicted in the example of FIG. 2, a power gating switch is referred to as a 'header switch' while a power gating switch implemented with nMOS transistors is referred to as a 'footer switch.'

The example of FIG. 2 includes an expanded view of one of the power switch cells 202 and the standard cell 208 for purposes of clarity. The power switch cell 202 is a double-height cell. In this example, 'double-height' refers to a height that is double, or approximately so, to the height of a single standard cell 208. The standard cell 208 has a height equivalent, or approximately so, to the height of an n-well.

The example power switch cell 202 of FIG. 2 is positioned with the top portion of the cell's boundary 204 centered (or approximately so) on an n-well 218 and a bottom portion of the boundary 204 centered (or approximately so) on another n-well 218. In this way, the power switch cell 202 is said to 'bridge' two parallel n-wells. Each of the n-wells, directly above and below the power switch cell 202 of FIG. 2, includes a space available for placement of a standard cell.

The example standard cell 208 of FIG. 2 is positioned directly below the power switch cell 202 in the same column and is positioned adjacent to the standard cell. The standard cell 208 includes a portion of pMOS logic 210 and a portion of nMOS logic 212. Generally, pMOS logic 210 is placed on an n-well while nMOS logic is placed on a p-type substrate. In the example of FIG. 2, the portion of nMOS logic 212 of the standard cell 208 is positioned on the p-type substrate 216. The portion of pMOS logic 214 of the standard cell 208 'faces' the power switch cell 202. That is, the standard cell 208 is placed so that the portion of pMOS logic 214 is positioned on the n-well 218 and is adjacent to the power switch cell 202. Logic of a standard cell is said to 'face' logic of a power switch cell when the logic of the standard cell is positioned adjacent the power switch cell.

In the example of FIG. 2, pMOS logic 214 of the standard cell 208 faces the pMOS logic 210 of the power switch cell 202 and as such, no P/N spacing tolerance 206 is required. The pMOS logic 210 of the power switch cell 202 is not restricted in size by the P/N spacing requirement. To that end, the power switch cell 202 may include a greater number of transistors or other pMOS logic without increasing the size of the cell boundary 204 compared to power switch cells of the prior art that constrained by the P/N spacing tolerance requirement. In the example of FIG. 2, for clarity of explanation, the pMOS logic 210 vertically spans approximately the entire cell boundary 204. The power switch cell 202 in the example of FIG. 2 utilizes the area within the cell's boundary 204 efficiently.

It is noted that the example pMOS power switch cell of FIG. 2 may be varied in width as desired by an integrated circuit designer or a cell designer. Greater cell width provides additional area within the cell boundary for logic.

It is also noted that, while the example integrated circuit layout of FIG. 2 includes a pMOS power switch cell 202, a p-type substrate 216, rows of n-wells 218, and the pMOS portion 214 of the standard cell 208 facing the power switch cell 202, one or more complementary embodiments may also provide area efficient power switches. The term 'complementary' here refers to the type of logic or doping, where pMOS logic is a complement of nMOS logic, a p-type substrate is a complement of an n-type substrate, and an n-well is a complement of a p-well. Some complementary embodiments of an integrated circuit layout, for example, may include an n-type substrate with interleaving p-wells, an nMOS-based power switch cell placed so as to bridge two parallel p-wells, and a standard cell placed so that an nMOS portion of the standard cell faces the nMOS-based power switch cell. In such an embodiment, nMOS logic of the power switch cell faces nMOS logic of the standard cell and no P/N spacing tolerance is required.

In the example of FIG. 2 (as well as other figures below), power switch cells and standard cells are described as being placed "on" a doped substrate or "on" doped wells, for ease and clarity of explanation. It is noted, however, that a cell, being an electronic representation of circuitry, is not actually physically placed on a doped substrate or doped well. Instead, the references in this specification describing a cell being placed on a doped substrate or well may refer to the cell's placement being specified electronically with respect to an electronic representation of the doped substrate and an electronic representation of the doped wells.

Figure 3:
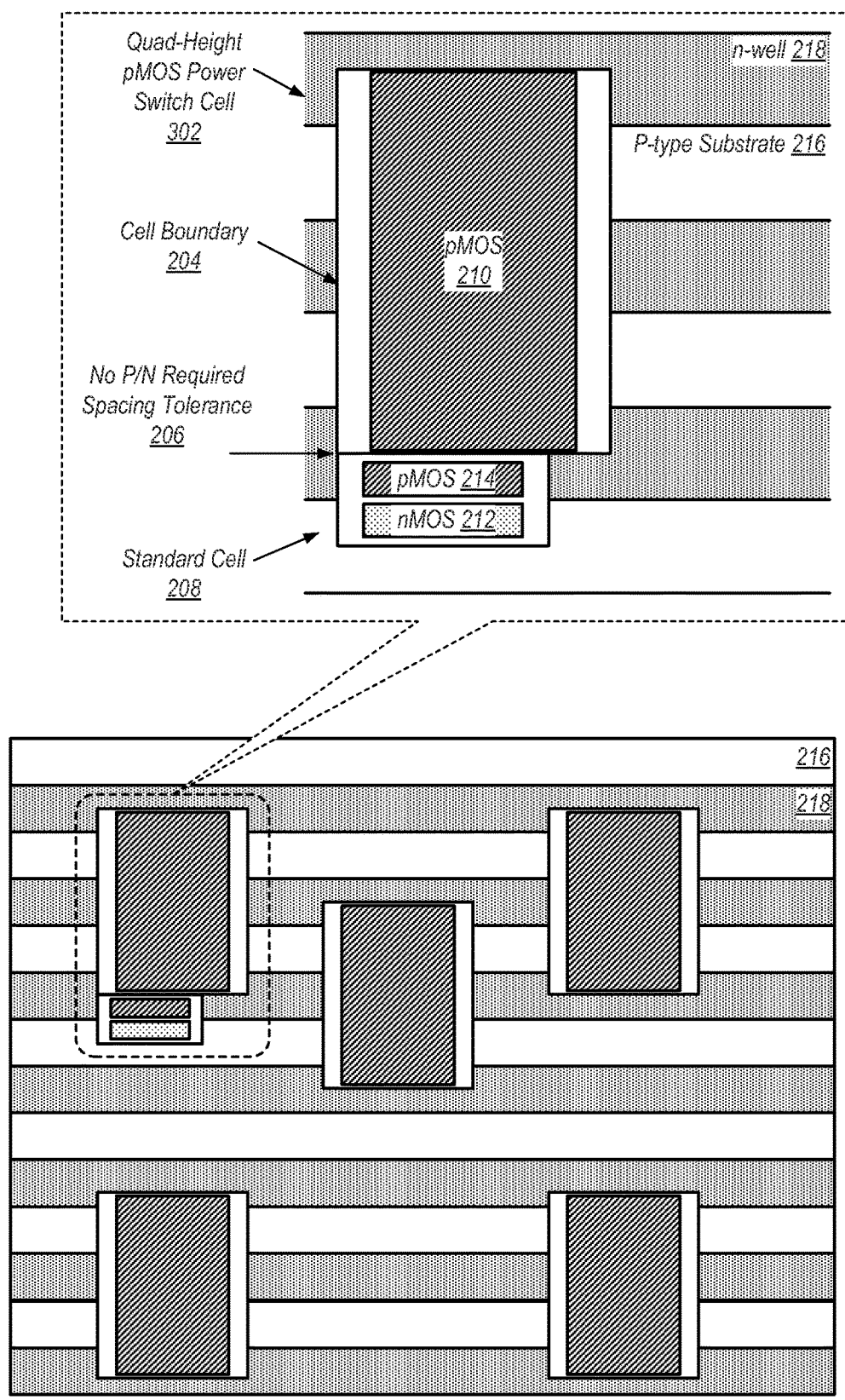
FIG. 3 sets forth a line drawing of an example integrated circuit layout with a quad-height area efficient power switch.

For further explanation, FIG. 3 sets forth a line drawing of another example integrated circuit layout with an area efficient power switch cell. The example integrated circuit layout of FIG. 3 is similar to that of FIG. 2 in that the layout of FIG. 3 also includes a p-type substrate 216 interleaved with parallel rows of n-wells 218, a number of pMOS-based power switch cells 302 arranged in columns, a standard cell 208 that includes a portion of pMOS logic 214, and a portion of nMOS logic 212.

The example integrated circuit layout of FIG. 3 differs from that of FIG. 2, however, in that the pMOS power switch cell 302 of FIG. 3 is quadruple the height of the standard cell 208. As mentioned above, standard cells typically have a height that is equivalent to the height of a row of a well. The quad-height power switch cell 302 of FIG. 3 is positioned so as to bridge two parallel n-wells 218. Rather than being adjacent parallel n-wells 218, the example quad-height power switch cell 302 bridges two n-wells, with another n-well between the two bridged n-wells 218.

Here, as in the example of FIG. 3, the standard cell is placed so that the pMOS logic 214 of the standard cell faces the quad-height power switch cell 302. That is, the pMOS logic 214 of the standard cell faces the pMOS logic 210 of the quad-height power switch cell 302. As such, no P/N spacing tolerance 206 is required between the pMOS logic 214 of the standard cell 208 and the pMOS logic 210 of the quad-height power switch cell 302.

It is noted that the example pMOS power switch cell of FIG. 3 may be varied in width as desired by an integrated circuit designer or a cell designer. Greater cell width provides additional area within the cell boundary for logic.

It is also noted that, as above in FIG. 2, although the layout of FIG. 3 is depicted with n-wells, p-type substrate, and pMOS power switch cells, complementary embodiments may also provide area efficiency. In such embodiments, quad-height power switch cells may include nMOS logic and placed so as to bridge two p-wells with another p-well between the two bridged wells. Further, in such embodiments, a standard cell may placed, either above or below, and adjacent to the quad-height nMOS power switch cell so that the nMOS portion of the standard cell faces the quad-height nMOS power switch cell and no P/N spacing tolerance is required.

Figure 4:
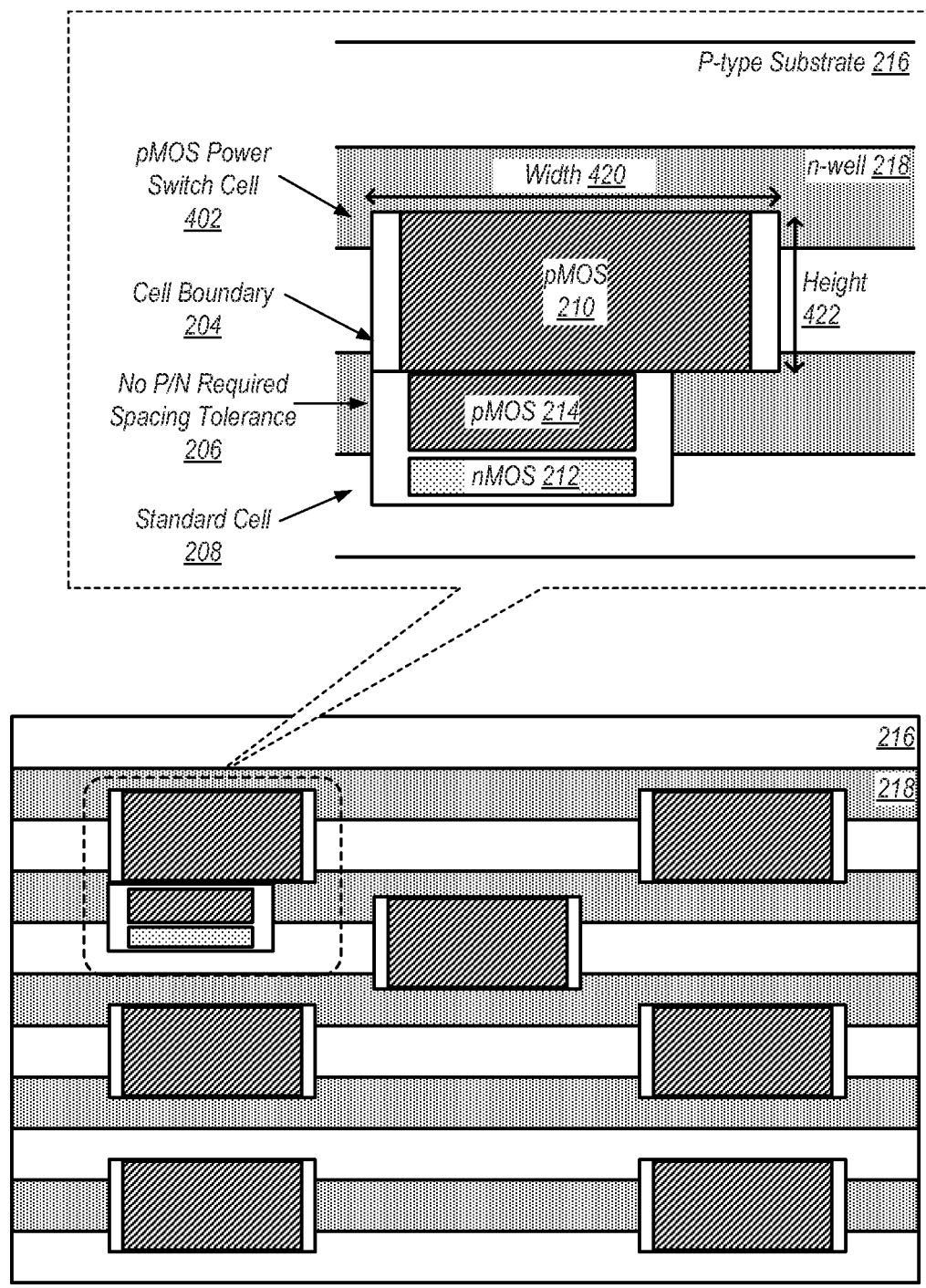
FIG. 4 sets forth a line drawing of an example integrated circuit layout with an area efficient power switch being less than double height and bridging two wells.

For further explanation, FIG. 4 sets forth a line drawing of another example integrated circuit layout with an area efficient power switch cell. The example integrated circuit layout of FIG. 3 is similar to that of FIG. 2 in that the layout of FIG. 3 also includes a p-type substrate 216 interleaved with parallel rows of n-wells 218, a number of pMOS-based power switch cells 402 arranged in columns, a standard cell 208 that includes a portion of pMOS logic 214, and a portion of nMOS logic 212.

The layout in the example of FIG. 4 differs from the layout of FIG. 2, however, in that in the layout of FIG. 4, the power switch cells 402 have a height 422 that is greater than a standard cell's height but less than double the height of the standard cell 208. While the power switch cell of FIG. 2 provides increased area efficiency by maintaining the cell boundary's double-height and increasing the height of the pMOS logic within the cell boundary, the example power switch cell 402 of FIG. 4 maintains the height of the logic, while decreasing the height of the cell boundary. As such, standard cells or other components may be placed in the area that would otherwise have been utilized by a double-height cell boundary, thus increasing area efficiency of the entire layout. As an example, the standard cell 208 in the layout of FIG. 4 includes additional pMOS logic 214 (the pMOS logic 214 is greater in height), filling the area that would otherwise have been filled by a double-height power switch cell.

The pMOS power switch 402 also differs from the power switch cell of FIG. 2 in that the width 420 of the power switch cell is increased relative to other embodiments. By increasing the width 420 of the power switch cell additional pMOS logic 210 may be included in the cell without increasing the height of the logic itself.

It is noted that, as above in FIG. 2, although the layout of FIG. 4 is depicted with n-wells, p-type substrate, and pMOS power switch cells, complementary embodiments may also provide area efficiency. In such embodiments, power switch cells may include nMOS logic and placed so as to bridge two p-wells with another p-well between the two bridged wells. Further, in such embodiments, a standard cell may placed, either above or below, and adjacent to the nMOS power switch cell so that the nMOS portion of the standard cell faces the nMOS power switch cell and no P/N spacing tolerance is required.

Figure 5:
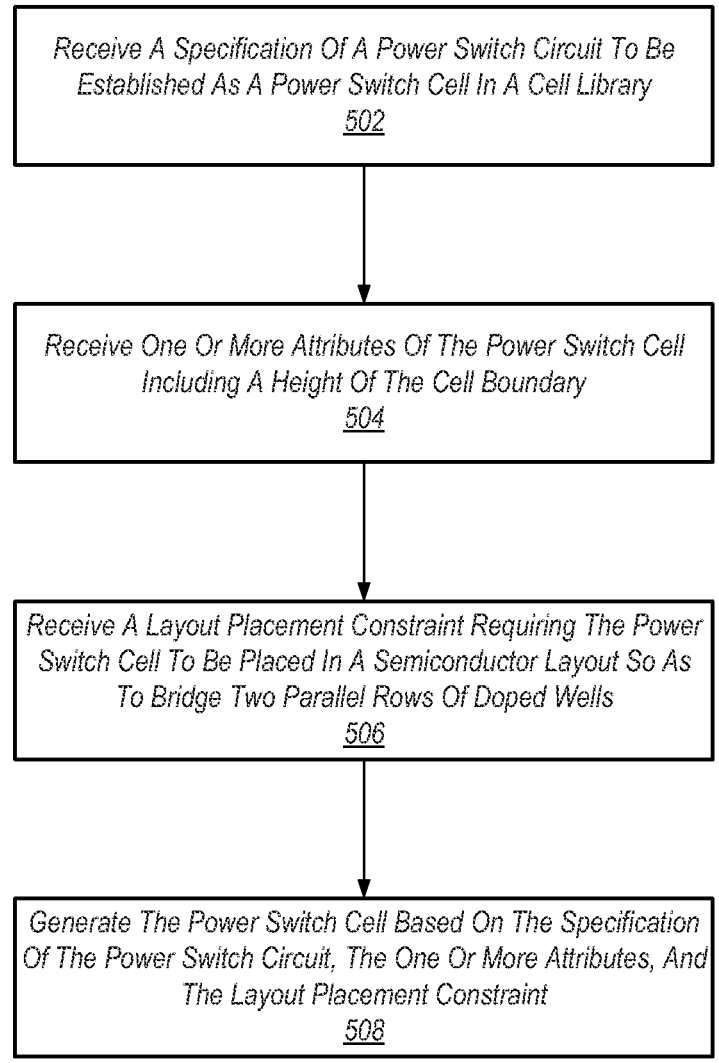
FIG. 5 sets forth a flow chart illustrating a method of generating an area efficient power switch cell for a cell library.

For further explanation, FIG. 5 sets forth a flow chart illustrating a method of generating an area efficient power switch cell for a cell library. The method of FIG. 5 may be carried out by a cell library design tool, a module of computer program that, when executed by a computer processor, cause the computer processor top generate the area efficient power switch cell as set forth in the example method of FIG. 5. One example of a cell library design tools includes Virtuoso Layout Editor™ from Cadence™.

In the method of FIG. 5 the cell library design tool may receive 502 a specification of a power switch circuit to be established as a power switch cell in a cell library. Receiving 502 a specification of a power switch circuit to be established as a power switch cell in a cell library may be carried out in various ways. A specification of a power switch circuit may for example be received, from a cell designer or other user, as a schematic of the circuit or as a transistor netlist. Such a transistor netlist may include nodal description of the transistors of the circuit, connections among the transistor nodes, their terminals (or ports) to the external environment, and so on. In some embodiments, a SPICE program may be utilized to verify the transistor netlist or schematic operates as expected with respect to power consumption, signal propagation delay, and other electrical characteristics and parameters.

The cell library design tool in the method of FIG. 5 may also receive 504 one or more attributes of the power switch cell including a height of the cell boundary. In some embodiments, the cell library design tool may receive a specification of a the cell boundary's height as double a standard cell's height, and in other embodiments, quadruple the standard cell's height. In addition to a height, the cell library design tool may also receive a width of the cell boundary, physical placement characteristics of the internal logic of the cell (e.g., mask data), and the like. Receiving (504) attributes of the cell boundary may also be described as generating a layout view of the power switch cell. The layout view of the standard cell may be organized into base layers, interconnect wiring layers, and via layers.

The cell library design tool in the method of FIG. 5 may also receive 506 a layout placement constraint requiring the power switch cell to be placed in a semiconductor layout so as to bridge two parallel rows of doped wells, where the parallel rows of doped wells are interleaved with doped substrate. Further, the doping of the wells is of a different type than the doping of the substrate. A layout placement constraint, as the term is used here, refers to a rule that governs physical placement of the cell in an integrated circuit layout. The cell library design tool may receive such a layout placement constraint, in various ways, including receiving the layout placement constraint from a cell designer or other user. The layout placement constraints may be integrated into a Layout Extraction Format (LEF) file or another type of file representing an abstract view of the cell.

Based on the specification of the power switch circuit, the one or more attributes, and the layout placement constraint, the cell library design tool in the method of FIG. 5 may generate 508 the power switch cell. Generating the power switch cell may include generating one or more data files that represent the circuit in various forms. For example, the cell library design tool may generate a mask data file specifying physical layout characteristics for fabricating the cell, a file specifying layout placement constraints for use by place-and-route tools, a file specifying logical functionality of the power switch cell, a file specifying electrical and timing characteristics of the power switch cell, a file specifying nodes available for connection of the power switch cell, a register transfer level (RTL) file specifying functional behavior of the power switch in the cell, and so on.

Once the power switch cell is generated the cell may be added to a cell library. Such a cell library may utilized by a place-and-route tool to generate an integrated circuit layout.

Figure 6:
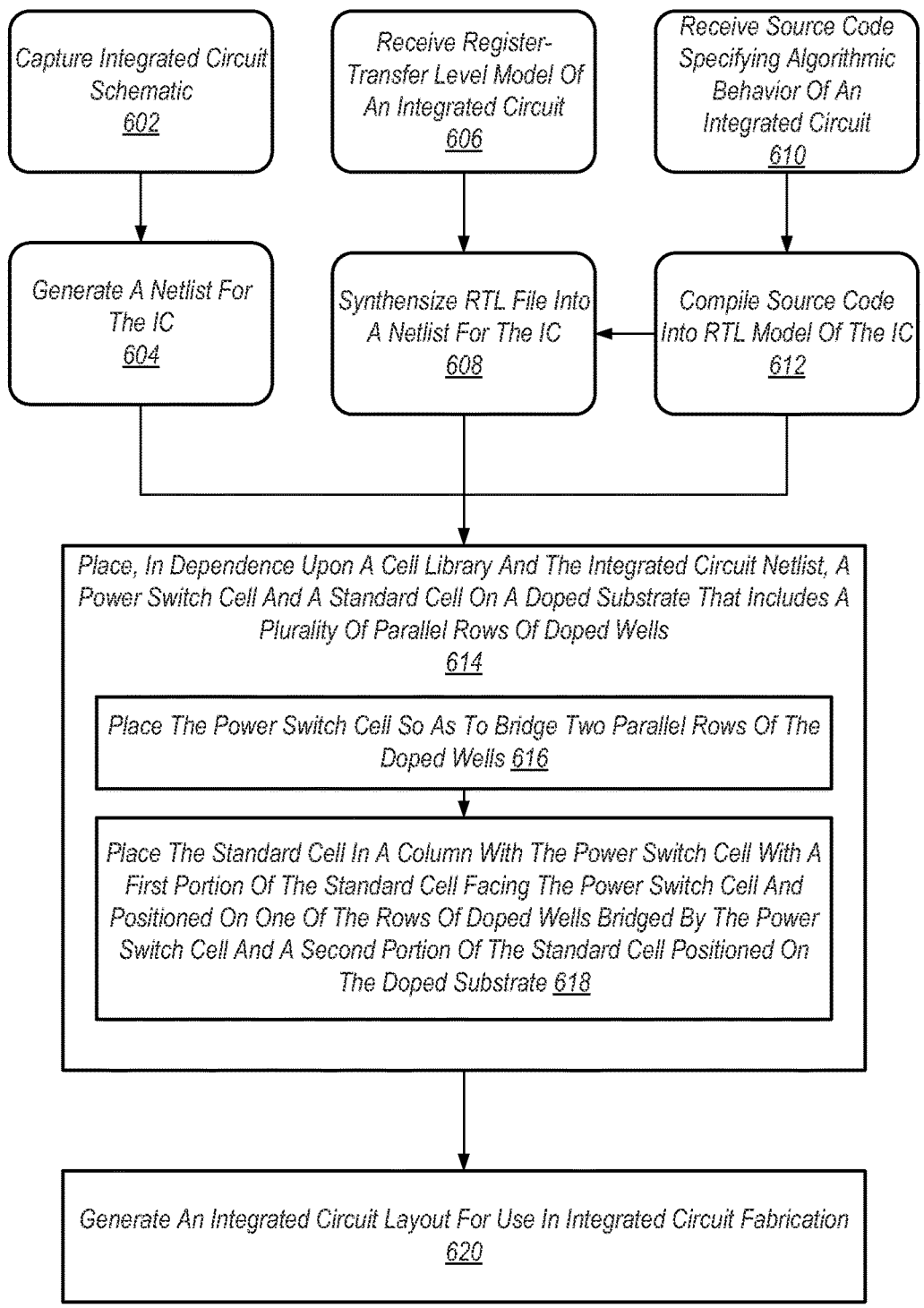
FIG. 6 sets forth a flow chart illustrating an method of generating an integrated circuit layout for use in fabrication that includes an area efficient power switch cell.

To that end, FIG. 6 sets forth a method of generating an integrated circuit layout that includes an area efficient power switch cell, such as those depicted in the example of FIG. 2-FIG. 4.

Various portions of the method of FIG. 6 may be carried out by various electronic design automation (EDA) tools or computer aided design (CAD) tools. Examples of such EDA or CAD tools include Synopsys' Design Compiler® or Cadence's Encounter® RTL Compiler, Synopsis' IC Compiler, and others. The various EDA or CAD tools configured to carry out the method of FIG. 6 are generally referred to here as a 'place-and-route' tool for purposes of clarity. A place-and-route tool, as the term is used here, refers to one or more modules of computer program instructions that, when executed by a computer processor, cause the processor to generate an integrated circuit layout and, more specifically, generate one or more files for use in fabrication of the integrated circuit. It is noted, however, that while in some embodiments each of these different tools is part of a single place-and-route tool package, in other embodiments each of these different tools is a standalone software tool.

The method of FIG. 6 sets forth several embodiments of generating a netlist of an integrated circuit for use in integrated circuit layout generation by a place-and-route tool. In one embodiment, a place-and-route tool captures 602 an integrated circuit schematic and generates 604 a netlist for the integrated circuit based on the captured schematic. In another embodiment, a place-and-route tool receives 606 a register-transfer level (RTL) model of an integrated circuit and synthesizes the RTL file into a netlist forth integrated circuit. Such an RTL file may be written in Verilog® or VHDL. In yet another embodiment, a place-and-route tool receives 610 source code specifying algorithmic behavior of an integrated circuit, compiles 612 the source code into an RTL model of the integrated circuit, and synthesizes 608 the RTL model into a netlist for the integrated circuit. In such an embodiment, the source code may be written in a high level language like ANSI C/C++, System C, or the like.

Once a netlist for the integrated circuit is generated, the place-and-route tool may place 614, in dependence upon a cell library and an integrated circuit netlist, a power switch cell and a standard cell and in a layout for the integrated circuit, where the integrated circuit will (upon fabrication) include a doped substrate that includes a plurality of parallel rows of doped wells. Said another way, the place-and-route tool may specifying placement of a power switch cell and specify placement of a standard cell within an electronic representation of the doped substrate. In such an embodiment, the netlist includes one or more power switch circuits and one or more circuits that may be implemented with standard cell. Such a place-and-route tool may place individual standard cells through use of a simulated annealing algorithm or any other suitable placement algorithm. In other embodiments, some standard cells and their associated nets, e.g., standard cells related to the distribution of the system clock, may have pre-determined positions to reduce noise or jitter.

In the example of FIG. 6, the doped substrate is interleaved among the rows of doped wells and the doping of the wells is of a different type than the doping of the substrate. That is, when the doped substrate is implemented as a p-type substrate, the doped wells are implemented as n-wells and when the doped substrate is implemented as an n-type substrate, the doped wells are implemented as p-wells.

In the method of FIG. 6, the place-and-route tool, in placing the power switch cell land standard cell, may place 616 the power switch cell so as to bridge two parallel rows of the doped wells and place the standard cell in a column with the power switch cell with a first portion of the standard cell facing the power switch cell and positioned on one of the rows of doped wells bridged by the power switch cell and a second portion of the standard cell positioned on the doped substrate. The first portion of the standard cell may include logic of a type complementary to the doping of the wells and the second portion may include logic of a type complementary to the doping of the substrate. The place-and-route tool may place the standard cell adjacent to the power switch cell in accordance with placement layout constraints specified by the power switch cell (as discussed above with respect to FIG. 5).

Finally, the place-and-route tool may generate 620 an integrated circuit layout for use in integrated circuit fabrication. The integrated circuit layout may be in a file format recognizable by fabrication and manufacturing software packages. In some embodiments, for example, the place-and-route tool may generate a graphic database system II (GDSII) file along with extracted netlists. In other embodiments, the integrated circuit layout may include various model files for top-level modeling, such as CeltIC ECHO files for top-level noise analysis for example.

Figure 7:
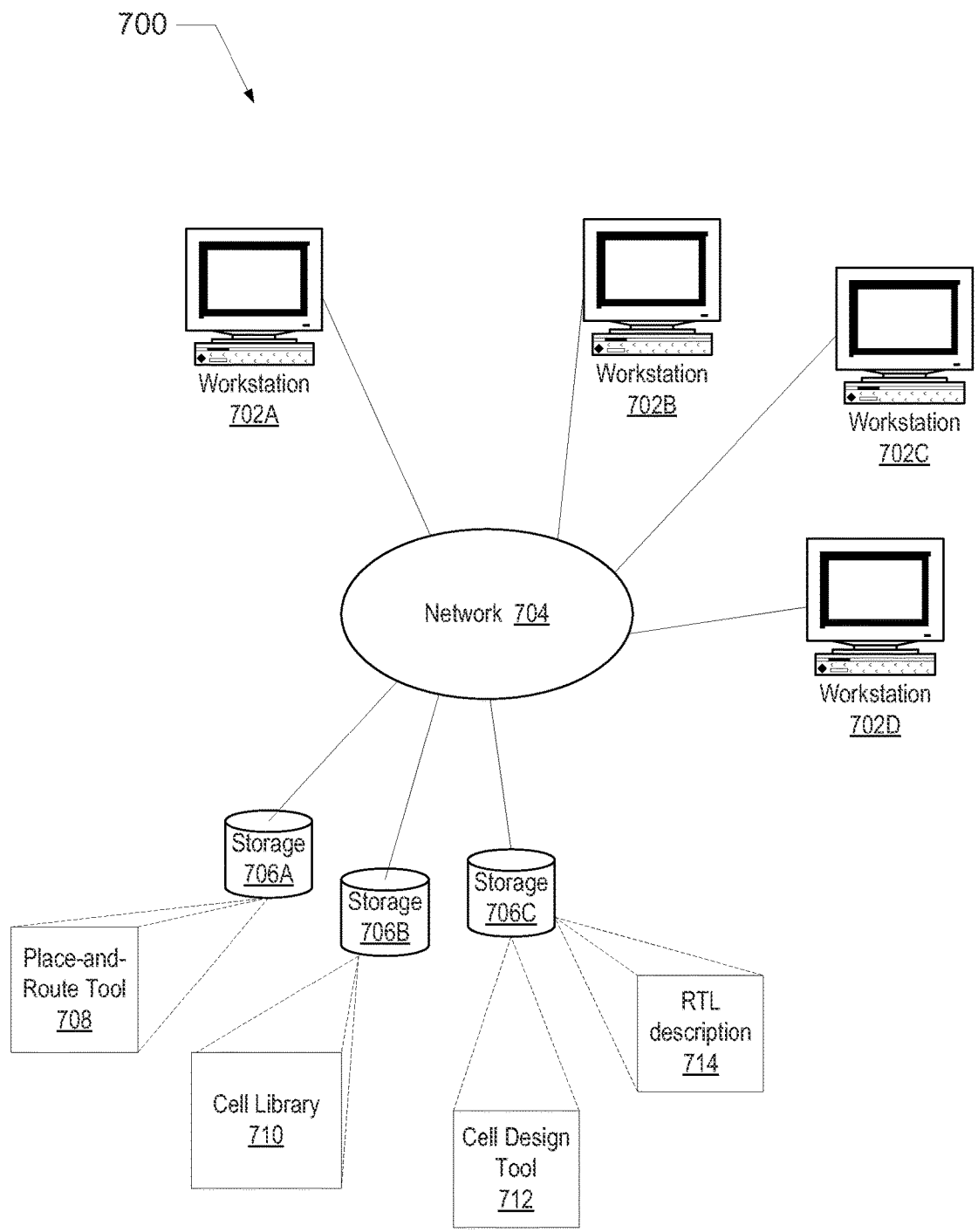
FIG. 7 sets forth a block diagram of an example system configured for generating an area efficient power switch cell and an integrated circuit layout based on the power switch cell.

For further explanation, FIG. 7 sets forth a block diagram of an example system configured for generating an area efficient power switch cell and an integrated circuit layout based on the power switch cell as described above with respect to FIG. 5 and FIG. 6.

The system 700 of FIG. 7 includes a number of workstations 702A-702D. The workstations are coupled together and to a plurality of storage devices designated 706A-706CA through a network 704. In one embodiment, each of workstations 702A-702D may be representative of any standalone computing platform that may include, for example, one or more processors, local system memory including any type of random access memory (RAM) device, monitor, input/output (I/O) means such as a network connection, mouse, keyboard, monitor, and the like (many of which are not shown for simplicity).

In one embodiment, storage devices 706A-706C may be representative of any type of mass storage device such as hard disk systems, optical media drives, tape drives, ram disk storage, and the like. As such, program instructions comprising electronic design automation tools (such as place-and-route tools 708, cell design tools 712, and the like) may be stored within any of the storage devices 706A-706C and loaded into the local system memory of any of the workstations for and during execution. As an example, as shown in FIG. 7, a place-and-route tool 708 is stored within storage device 706A, a standard cell library 710 is stored within storage device 706B, a cell design tool 712 and an RTL description 714 of an integrated circuit is stored in 706C.

The cell design tool 712 may be executed by any of the workstations to generate an area efficient power switch cell (as described above with respect to FIG. 5) for the cell library 710. The place-and-route tool 708 may be executed by any of the workstations to generate a layout for an integrated circuit in dependence upon the RTL description 714 and the cell library 710 that includes the area efficient power switch cell (as described above with respect to FIG. 6).

Figure 8:
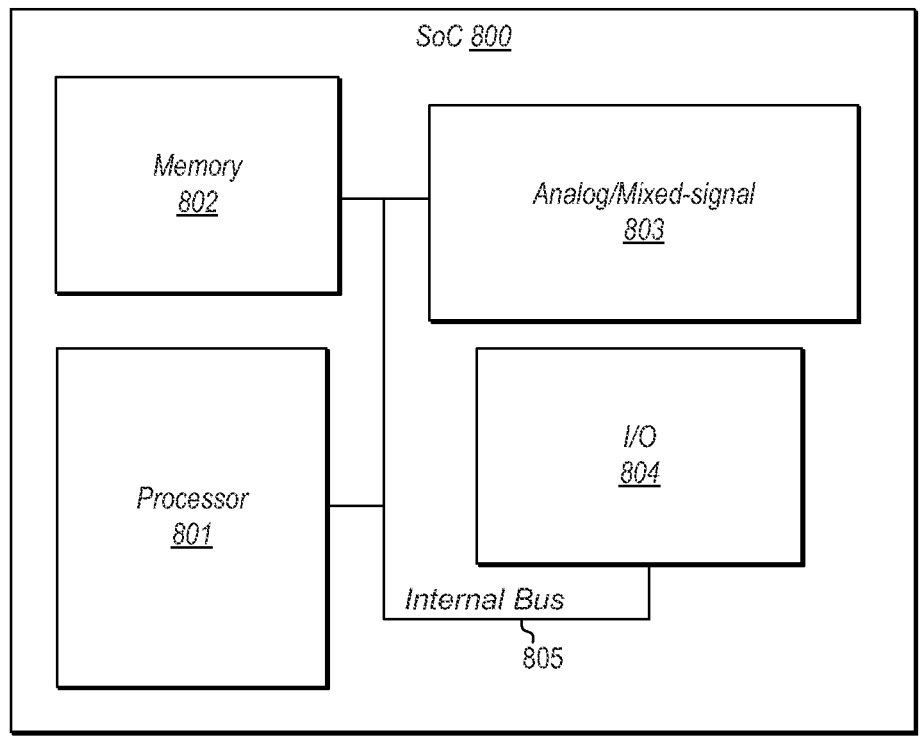
FIG. 8 sets forth a block diagram of an example system-on-chip.

FIG. 8 sets forth a block diagram of an example system-on-chip, an example integrated circuit which may be manufactured in accordance with an integrated circuit layout. The SoC 800 includes a microprocessor 801 coupled to memory block 802, and analog/mixed-signal block 803, and I/O block 804 through internal bus 805. In various embodiments, SoC 800 may be configured for use in a mobile computing application such as, e.g., a tablet computer or cellular telephone.

Memory block 802 may include any suitable type of memory such as a Static Random Access Memory (SRAM), a Read-only Memory (ROM), Electrically Erasable Programmable Read-only Memory (EEPROM), or a FLASH memory, for example. It is noted that in the embodiment of a SoC illustrated in FIG. 8, a single memory block is depicted. In other embodiments, any suitable number of memory blocks may be employed.

Analog/mixed-signal block 803 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 803 may be configured to perform power management tasks with the inclusion of on-chip power supplies and voltage regulators. Analog/mixed-signal block 803 may also include, in some embodiments, radio frequency (RF) circuits that may be configured for operation with cellular telephone networks.

I/O block 804 may be configured to coordinate data transfer between SoC 801 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 804 may be configured to implement a version of Universal Serial Bus (USB) protocol or IEEE 1394 (Firewire®) protocol.

I/O block 804 may also be configured to coordinate data transfer between SoC 801 and one or more devices (e.g., other computer systems or SoCs) coupled to SoC 801 via a network. In one embodiment, I/O block 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 804 may be configured to implement multiple discrete network interface ports.

The various functional blocks within SoC 800 may be designed using a standard cell methodology, place-and-route tools, and cell design methodologies described above. For example, and of the memory 802, processor 801, analog/mixed-signal 803, and I/O 804 blocks may include one or more power switches and one or more logic blocks. The power switches may be designed as power switch cells in accordance with the method of FIG. 5 above. The logic block may be laid out for fabrication with the power switch cell as a standard cell in accordance with the method FIG. 6 above. In this way, any of the example functional blocks may be implemented with an area efficient power switch cell.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer implemented method comprising:
   receiving, in a cell library design tool, executed using a computer processor, a specification of a power switch circuit to be established as a power switch cell in a cell library;
   receiving, in the cell library design tool, one or more attributes of the power switch cell including a height of the cell boundary, the height of the cell boundry being at least double a standard cell's height, wherein the standard cell's height is equivalent to the height of a doped well;
   receiving, in the cell library design tool, a layout placement constraint requiring the power switch cell to be placed in a semiconductor layout so as to bridge two parallel rows of doped wells, the parallel rows of doped wells interleaved with a doped substrate, wherein the doping of the doped wells is of a different type than the doping of the substrate; and
   generating, in the cell library design tool, one or more data files representing the power switch cell based on the specification of the power switch circuit, the one or more attributes, and the layout placement constraint.

2. The method of claim 1, wherein:
   the power switch cell further comprises a header cell configured for power-gating;
   the parallel rows of doped wells comprise parallel rows of n-wells; and
   the doped substrate further comprises a p-type substrate.

3. The method of claim 1, wherein:
   the power switch cell further comprises a footer cell configured for power-gating;
   the parallel rows of doped wells comprise parallel rows of p-wells; and
   the doped substrate further comprises an n-type substrate.

4. The method of claim 1, further comprising:
   receiving, in the cell library design tool, a layout placement constraint requiring the standard cell to be placed in the semiconductor layout in a column with the power switch cell, with a first portion of the standard cell facing the power switch cell and placed so as to be positioned on one of the rows of doped wells bridged by the power switch cell and with a second portion of the standard cell placed so as to be positioned on the doped substrate, wherein the first portion comprises logic of a type complementary to the doping of the wells, and the second portion comprises logic of a type complementary to the doping of the substrate.

5. The method of claim 4, wherein the layout placement constraint requiring the standard cell to be placed in the semiconductor layout requires the power switch cell to have a height greater than the standard cell's height.

6. The method of claim 4, wherein the layout placement constraint requiring the standard cell to be placed in the semiconductor layout requires the power switch cell to have a height at least double the standard cell's height.

7. The method of claim 1, further comprising providing the one or more data files representing the power switch cell to a place-and-route tool, and generating, using the place-and-route tool, an integrated circuit layout that includes the power switch cell.

8. The method of claim 1, wherein the one or more attributes of the power switch cell received in the cell library design tool are provided as input to the cell library design tool by a user of the cell library design tool.

9. A non-transitory computer readable storage medium including program instructions executable by a processor to:

receive a specification of a power switch circuit to be established as a power switch cell in a cell library;

receive one or more attributes of the power switch cell including a height of the cell boundary;

receive a first layout placement constraint requiring the power switch cell to be placed in a semiconductor layout so as to bridge two parallel rows of doped wells, the parallel rows of doped wells interleaved with a doped substrate, wherein the doping of the doped wells is of a different type than the doping of the substrate;

receive a second layout placement constraint requiring a standard cell to be placed in the semiconductor layout in a column with the power switch cell, with a first portion of the standard cell facing the power switch cell and placed so as to be positioned on one of the rows of doped wells bridged by the power switch cell and with a second portion of the standard cell placed so as to be position on the doped substrate, wherein the first portion comprises logic of a type complementary to the doping of the wells, and the second portion comprises logic of a type complementry to the doping of the substrate; and generate one or more data files representing the power switch cell based on the specification of the power switch circuit, the one or more attributes, the first layout placement constraint, and the second layout placement constraint.

10. The non-transitory computer readable storage medium of claim 9, wherein the program instructions executable by the processor to receive one or more attributes of the power switch cell including the height of the cell boundary further comprise program instructions executable by the processor to receive the height of the cell boundary of greater than the standard cell's height, wherein the standard cell's height is equivalent to the height of a doped well.

11. The non-transitory computer readable storage medium of claim 9, wherein the program instructions executable by the processor to receive one or more attributes of the power switch cell including the height of the cell boundary further comprise program instructions executable by the processor to receive the height of the cell boundary of at least double the standard cell's height, wherein the standard cell's height is equivalent to the height of a doped well.

12. The non-transitory computer readable storage medium of claim 9, wherein:
the power switch cell further comprises a header cell configured for power-gating;
the parallel rows of doped wells comprise parallel rows of n-wells; and
the doped substrate comprises a p-type substrate.

13. The non-transitory computer readable storage medium of claim 9, wherein:
the power switch cell further comprises a footer cell configured for power-gating;
the parallel rows of doped wells comprise parallel rows of p-wells; and
the doped substrate comprises an n-type substrate.

14. The non-transitory computer readable storage medium of claim 9, wherein the standard cell has a height equivalent to the height of one of the doped wells, and the power switch cell has a height greater than the standard cell's height.

15. The non-transitory computer readable storage medium of claim 9, wherein the standard cell has a height equivalent to the height of one of the doped wells, and the power switch cell has a height at least double the standard cell's height.

16. The non-transitory computer readable storage medium of claim 9, wherein the first layout placement constraint is provided as input by a user of the processor.

17. A system comprising:
a non-transitory computer memory configured to store computer program instructions; and
a computer processor configured to execute the computer program instructions and to cause the system to:
receive, in a cell library design tool, a specification of a power switch circuit to be established as a power switch cell in a cell library;
receive, in the cell library design tool, one or more attributes of the power switch cell including a height of the cell boundary comprising at least double a standard cell's height, wherein the standard cell's height is equivalent to the height of a doped well;
receive, in the cell library design tool, a layout placement constraint requiring the power switch cell to be placed in a semiconductor layout so as to bridge two parallel rows of doped wells, the parallel rows of doped wells interleaved with a doped substrate, wherein the doping of the doped wells is of a different type than the doping of the substrate; and
generate, in the cell library design tool, one or more data files representing the power switch cell based on the specification of the power switch circuit, the one or more attributes, and the layout placement constraint.

18. The system of claim 17, wherein the computer processor is further configured to execute the computer program instructions and to cause the system to:
receive, by the cell library design tool, a layout placement constraint requiring the standard cell to be placed in the semiconductor layout in a column with the power switch cell, with a first portion of the standard cell facing the power switch cell and placed so as to be positioned on one of the rows of doped wells bridged by the power switch cell and with a second portion of the standard cell placed so as to be positioned on the doped substrate, wherein the first portion comprises logic of a type complementary to the doping of the wells, and the second portion comprises logic of a type complementary to the doping of the substrate.

19. The system of claim 18, wherein the standard cell has a height equivalent to the height of one of the doped wells, and the power switch cell has a height greater than the standard cell's height.

20. The system of claim 17, wherein the computer processor is further configured to execute the computer program instructions and to cause the system to:
provide the one or more data files representing the power switch cell to a place-and-route tool; and
generate, using the place-and-route tool, an integrated circuit layout that includes the power switch cell.

* * * * *